US010748917B2

(12) United States Patent
Lee et al.

(10) Patent No.: US 10,748,917 B2
(45) Date of Patent: Aug. 18, 2020

(54) SEMICONDUCTOR MEMORY COMPONENT INTEGRATING A NANO-BATTERY, SEMICONDUCTOR DEVICE INCLUDING SUCH A COMPONENT AND METHOD USING SUCH A DEVICE

(71) Applicant: COMMISSARIAT A L'ENERGIE ATOMIQUE ET AUX ENERGIES ALTERNATIVES, Paris (FR)

(72) Inventors: Daeseok Lee, Grenoble (FR); Gabriel Molas, Grenoble (FR); Sami Oukassi, Saint-Egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/970,208

(22) Filed: May 3, 2018

(65) Prior Publication Data
US 2018/0323205 A1 Nov. 8, 2018

(30) Foreign Application Priority Data

May 4, 2017 (FR) ...................................... 1753920

(51) Int. Cl.
*H01L 27/115* (2017.01)
*H01L 27/11568* (2017.01)
(Continued)

(52) U.S. Cl.
CPC ........ *H01L 27/11568* (2013.01); *H01L 27/24* (2013.01); *H01L 27/2409* (2013.01);
(Continued)

(58) Field of Classification Search
CPC .............. H01L 27/11568; H01L 27/24; H01L 27/2409; H01L 27/249; H01L 29/7923; H01L 29/7926
See application file for complete search history.

(56) References Cited

U.S. PATENT DOCUMENTS 9,437,606 B2 * 9/2016 Makala ............. H01L 27/11582
10,083,974 B1 * 9/2018 Huang ................ H01L 45/1233
(Continued)

FOREIGN PATENT DOCUMENTS

CN 10768708 A * 8/2019

OTHER PUBLICATIONS

Bai, Y., et al., "Study of Multi-level Characteristics for 3D Vertical Resistive Switching Memory," Scientific Reports, 4 : 5780, Published Jul. 22, 2014, 7 pages.
(Continued)

*Primary Examiner* — Matthew L Reames
(74) *Attorney, Agent, or Firm* — Pillsbury Winthrop Shaw Pittman LLP

(57) ABSTRACT

A semiconductor component includes a first electrode, designated flat electrode, defining a plane; a second electrode, designated active electrode, separated from the first electrode by an electrolyte layer; a pillar, designated vertical pillar, extending essentially along an axis perpendicular to the plane defined by the flat electrode, the pillar including a third electrode, designated vertical electrode and an information storage layer, the information storage layer covering a surface of the vertical electrode; the flat electrode and the vertical pillar being laid out so as to form a memory point. In addition, the materials of the active electrode and the electrolyte layer are chosen so as to form an energy storage zone with the flat electrode.

15 Claims, 11 Drawing Sheets

(51) Int. Cl.
*H01L 27/24* (2006.01)
*H01L 45/00* (2006.01)
*H01L 29/792* (2006.01)

(52) U.S. Cl.
CPC ........ *H01L 27/249* (2013.01); *H01L 29/7923* (2013.01); *H01L 29/7926* (2013.01); *H01L 45/1233* (2013.01); *H01L 45/145* (2013.01); *H01L 45/1675* (2013.01); *H01L 45/04* (2013.01); *H01L 45/06* (2013.01); *H01L 45/1226* (2013.01); *H01L 45/144* (2013.01); *H01L 45/146* (2013.01)

(56) References Cited

U.S. PATENT DOCUMENTS

| | | |
|---|---|---|
| 2003/0048744 A1 | 3/2003 | Ovshinsky et al. |
| 2006/0186446 A1 | 8/2006 | Kim et al. |
| 2013/0021834 A1* | 1/2013 | Koyama ............ H01L 27/0207 365/148 |
| 2013/0189592 A1 | 7/2013 | Roumi et al. |
| 2014/0264533 A1* | 9/2014 | Simsek-Ege ........ H01L 27/1158 257/316 |
| 2015/0086809 A1* | 3/2015 | Lemke ............. H01M 10/0436 429/7 |
| 2016/0071565 A1 | 3/2016 | Lemke |

OTHER PUBLICATIONS

Valov, I., et al., "Nanobatteries in redox-based resistive switches require extension of memristor theory," Nature Communications, Published Apr. 23, 2013, 9 pages.

* cited by examiner

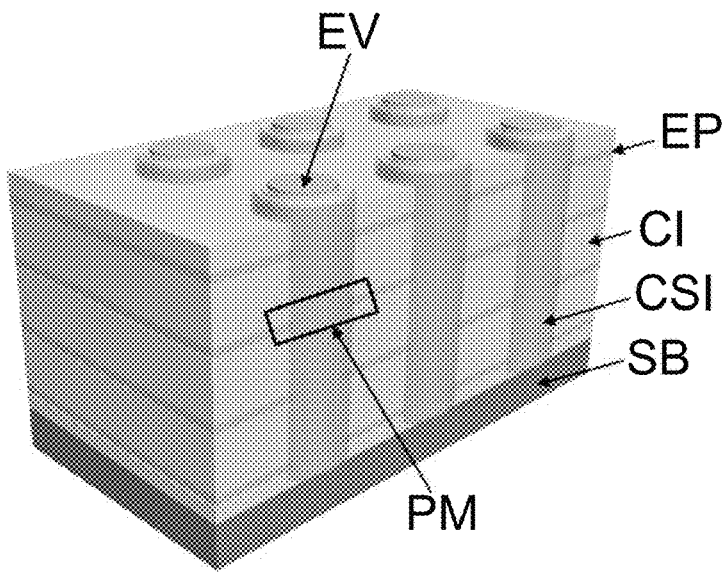
Fig. 1
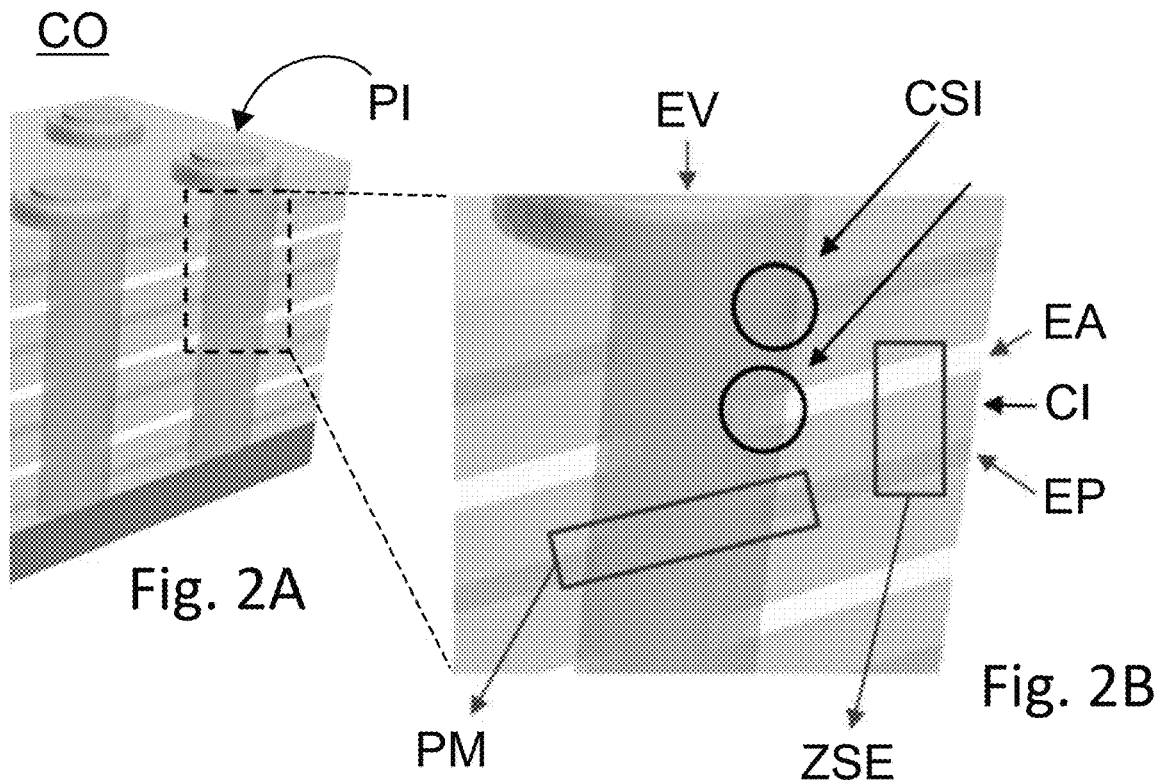
Fig. 2A
Fig. 2B
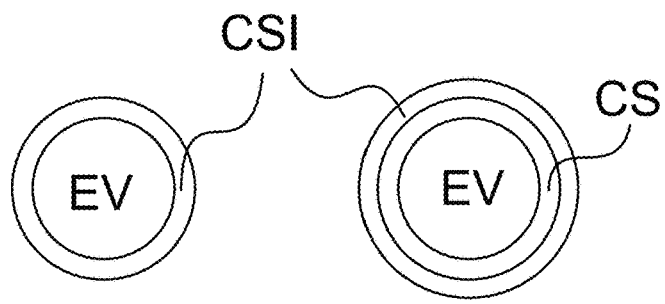
Fig. 2C
Fig. 2D

Initialisation

Re-initialisation

SEMICONDUCTOR MEMORY COMPONENT INTEGRATING A NANO-BATTERY, SEMICONDUCTOR DEVICE INCLUDING SUCH A COMPONENT AND METHOD USING SUCH A DEVICE

CROSS REFERENCE TO RELATED APPLICATIONS

This application claims priority to French Patent Application No. 1753920, filed May 4, 2017, the entire content of which is incorporated herein by reference in its entirety.

FIELD

The technical field of the invention is that of semiconductor components. The present invention relates to a semiconductor memory component and in particular a semiconductor memory component in which a nano-battery is integrated. The invention also relates to a semiconductor device including such a component as well as a method using such a device.

BACKGROUND

The use of vertical structures to obtain dense memories is a practice known to those skilled in the art. It has notably been implemented with flash memories as is for example described in the document US 2006/0186446.

More recently, a similar structure has been proposed, but this time using resistive memories. This is notably detailed in the document "*Study of Multi-level Characteristics for 3D Vertical Resistive Switching Memory*", Scientific Report (2014). As illustrated in FIG. 1, this document describes a memory device including a plurality of first electrodes, designated flat electrodes EP, each first electrode EP of the plurality of first electrodes EP being separated from two adjacent electrodes EP of the plurality of first electrodes EP by a layer of an insulating material CI. The device also comprises at least one pillar PI, designated vertical pillar PI, extending essentially along an axis perpendicular to the planes defined by the flat electrodes EP, the pillar PI including a third electrode EV, designated vertical electrode EV and an information storage layer CSI, the information storage layer CSI covering a surface of the vertical electrode EV. In addition, in this device, each flat electrode EP is laid out so as to form a memory point PM with the vertical pillar PI. Thus, for each pillar PI, a plurality a memory points PM constituting a memory cell is obtained.

In such a device, it is possible to associate a surface with each memory cell. However, only a part of this surface is actually used for the storage of information and the remainder of the surface occupied by a memory cell does not support any functionality. In addition, if it is wished to add a battery to such a memory device, it is necessary to produce the battery during additional steps on another part of the substrate used for the manufacture of the memory device, the latter further occupying an additional surface.

Certainly, it has recently been demonstrated, in the article of Nature Communications, Valov et al., 2784, 2013, that a battery effect can be measured in a resistive random access memory type component. This article discloses that a resistive random access memory type component, the operation of which is based on the occurrence of oxidation-reduction reactions, makes it possible to make an intrinsic electromotive force or emf stemming from the movement of ions appear.

The authors thus make the experimental and theoretical demonstration of the existence, in this type of component (here a resistive random access memory), of an electromotive force resulting from the creation of different chemical potential gradients between the two electrodes of the component when no filament type conductive path is created between them. This electromotive force is considered as a voltage generated by the component and may be obtained by dissolution of an active electrode in the active zone (here an electrolyte) by an electrochemical process, which the authors consider as being the demonstration of a "nano-battery" effect.

However, the authors conclude that the electromotive force observed only suggests the existence of a nano-battery effect and propose the extension of theoretical models able to describe the physical phenomena governing the operation of resistive random access memories in integrating this effect. The article thus does not disclose all the characteristics necessary for the operation of a memory point for the storage of energy and does not describe the concrete feasibility of such an application. In particular, the electromotive force is only measured in the oxidised state, which would correspond uniquely to the discharged state of a battery. In addition, no demonstration of the repeatability or the reversibility of the phenomena described within the component is made. It is important to note that knowledge of this application (which can in no way be deduced from the documents cited previously) would lead to the use of a part of the memory points as place for storage of energy without resolving the problem of the unused surface.

There thus exists a need for a memory device of which the whole of the surface of a memory cell is used to fulfill a function. A need further exists for such a device making it possible to easily integrate a battery.

SUMMARY

An aspect of the invention offers a solution to the aforementioned problems, by making it possible to store energy using the unused surfaces of devices of the prior art to produce one or more energy storage zones so as to obtain one or more nano-batteries.

To do so, a first aspect of the invention relates to a semiconductor component including:
- a first electrode, designated flat electrode, defining a plane;
- a second electrode, designated active electrode, separated from the first electrode by an electrolyte layer;
- a pillar, designated vertical pillar, extending essentially along an axis perpendicular to the plane defined by the flat electrode, the pillar including a third electrode, designated vertical electrode and an information storage layer, the information storage layer covering a surface of the vertical electrode; the flat electrode and the vertical pillar being laid out so as to form a memory point.

In addition, in the component according to an embodiment of the invention, the materials of the active electrode and the electrolyte layer are chosen so as to form an energy storage zone with the flat electrode. Active electrode is taken to mean an electrode composed of an ion source material and electrolyte layer is taken to mean a layer of insulating material within which the ions emitted by the active electrode can diffuse. Ion source material is taken to mean a material including at least one metal capable of releasing metal ions (such as copper which releases copper ions $Cu^{2+}$) or a material capable of storing and returning ions (for example silicon).

Thanks to the invention, it is possible to integrate within the unused surface of a memory component an energy storage zone which could next be used to supply the component or other components of a device in which the component will be integrated. In addition, the manufacture of such a component requires fewer manufacturing steps, employs less material and makes the integration of an energy storage element within a memory circuit easier.

Apart from the characteristics that have just been mentioned in the preceding paragraph, the component according to a first aspect of the invention may have one or more additional characteristics among the following, considered individually or according to all technically possible combinations thereof.

Beneficially, the flat electrode comprises a first layer and a second layer, the first layer facing the active electrode and being constituted of an ion source material, the second layer and the vertical pillar forming the memory point and the first layer, the electrolyte layer and the active electrode forming the energy storage zone.

Thus, an information storage zone is obtained which, in addition to the source of ions that the active electrode represents, has a second source of ions at the level of the first layer of the flat electrode.

Beneficially, the vertical pillar further includes a selection layer, the selection layer being situated between the vertical electrode and the information storage layer or on the information storage layer.

Thus, leakage currents between the vertical electrode and the flat electrode are limited during writing operations when the memory point associated with the electrodes is not selected. Such a layer is also called "back-end selector" in devices of the prior art.

Beneficially, the component according to an embodiment of the invention comprises a plurality of flat electrodes, a plurality of electrolyte layers and a plurality of active electrodes, each flat electrode of the plurality of flat electrodes being laid out so as to form a memory point with the vertical pillar. In addition, each active electrode of the plurality of active electrodes is separated from a flat electrode of the plurality of flat electrodes by an electrolyte layer of the plurality of electrolyte layers so as to form an energy storage zone.

Thus, it is possible to stack the memory points and the information storage zones and to obtain a plurality of memory points and a plurality of information storage zones per vertical pillar. The density of the memory and the energy storage per surface unit of the component are thereby increased.

Beneficially, each flat electrode comprises a third layer, the third layer facing an active electrode and being constituted of an ion source material.

Thus, when the device comprises a plurality of flat electrodes and a plurality of active electrodes, each face of each active electrode is facing a layer constituted of an ion source material.

Beneficially, the first layer and/or the third layer of the flat electrode or of each flat electrode are not in contact with the vertical pillar. Alternatively, the first layer and/or the third layer of the flat electrode or of each flat electrode are separated from the or from each vertical pillar by an insulating material.

Thus, during operations of writing the memory points, it is ensured that the filament formed between the vertical pillar and the flat electrode is formed between the second layer of the flat electrode and the vertical pillar and not between the vertical pillar and the first or the third layer.

Beneficially, the material of the vertical electrode and the material of the information storage layer are chosen so as to form, with the flat electrode or with each flat electrode of the plurality of flat electrodes, a phase change memory point or a resistive memory point. Thus, the component according to the invention may be adapted to different types of memory.

Beneficially, the component according to an embodiment of the invention includes a plurality of vertical pillars each vertical pillar being laid out so as to form a memory point with the flat electrode or with each flat electrode of the plurality of flat electrodes. Thus, it is possible to obtain a larger number of memory points per component.

Beneficially, the projection of the vertical pillars of the plurality of vertical pillars onto a plane parallel to the plane formed by the flat electrode or to the planes formed by the flat electrodes of the plurality of flat electrodes forms an array of which the unit cell is a square cell or a lozenge-shaped cell.

Thus, it is possible to favour the memory functionality or the energy storage functionality as a function of the arrangement of the pillars, enabling an additional degree of freedom during the design of a component according to the invention.

A second aspect of the invention relates to a semiconductor device including a component according to a first aspect of the invention, the device comprising a system so that the component is used for the storage of information and/or for the storage of energy.

Thus, it is possible to obtain a device within which a component according to a first aspect of the invention may be used as energy storage system and/or as information storage system.

Beneficially, the device includes a second component according to a first aspect of the invention and comprises a system so that the second component is used for the storage of information and/or for the storage of energy.

Thus, it is possible to obtain a device within which two components according to a first aspect of the invention are used as energy storage system and/or information storage system. This configuration is particularly beneficial if the first device is adapted to favour the storage of energy and supply with energy the second device, the latter then being adapted to favour the storage of information.

A third aspect of the invention relates to a method for using a device according to a second aspect of the invention comprising:
  a step in which at least one among the first or the second semiconductor components is used for the storage of information;
  a step in which at least one among the first or the second semiconductor components is used for the storage of energy.

Thus, it is possible to use one of the two components to supply the second or instead to ensure that each component supplies itself.

Beneficially, the energy necessary for the step of using at least one component for the storage of information is supplied by the energy stored during the step in which at least one component is used for the storage of energy.

Thus, the method makes it possible not to have to resort to an external energy source such as a battery not integrated in the device.

Aspects of the invention and its different applications will be better understood on reading the description that follows and by examining the figures that accompany it.

BRIEF DESCRIPTION OF THE FIGURES

The figures are presented for indicative purposes and in no way limit the invention.

FIG. 1 shows a schematic representation of a memory device according to the prior art.

FIGS. 2A to 2D show a semiconductor device according to an embodiment of a first aspect of the invention.

DETAILED DESCRIPTION

Figure 3A:
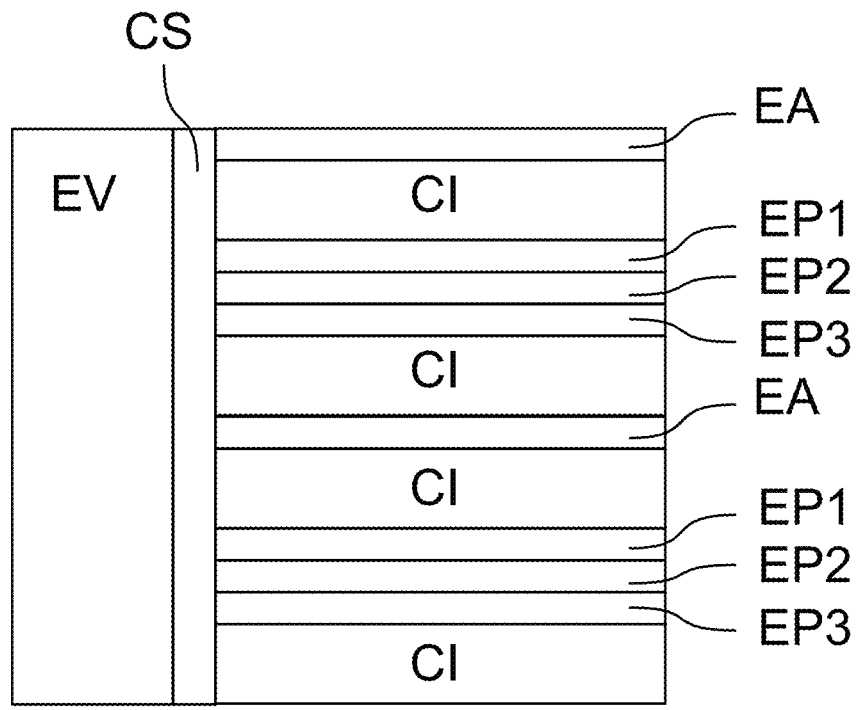
FIGS. 3A and 3B show two embodiments of a semiconductor device according to a first aspect of the invention.

Unless stated otherwise, a same element appearing in the different figures has a single reference.

A first embodiment according to a first aspect of the present invention illustrated in FIGS. 2A, 2B and 2C relates to a semiconductor component including a first electrode, designated flat electrode EP, defining a plane and a second electrode, designated active electrode EA, separated from the first electrode by an electrolyte layer CI. It also comprises a pillar PI, designated vertical pillar, extending essentially along an axis perpendicular to the plane defined by the flat electrode EP. As illustrated in FIG. 2C which represents a section of a pillar PI along a plane perpendicular to the main axis of the pillar, the pillar PI includes a third electrode, designated vertical electrode EV, and an information storage layer CSI, the information storage layer CSI covering a surface of the vertical electrode EV. In addition, the flat electrode EP, the active electrode EA and the electrolyte layer CI surround the vertical pillar PI in order that the information storage layer CSI, the vertical electrode EV of the vertical pillar PI and the flat electrode EP are laid out so as to form a memory point PM. The memory point PM thereby obtained makes it possible to store information by the modification of the resistance of the information storage layer CSI, each resistance being associated with a logic state. This resistance is modified by the application of a voltage between the vertical electrode EV and the flat electrode EP, in other words by applying a voltage at the level of the memory point PM. As a function of the materials chosen to manufacture the vertical electrode EV and the information storage layer CSI, the memory point PM may be a phase change memory point PM or a resistive memory point PM. For example, in order to obtain a resistive memory point PM, one could choose an information storage layer made of $HfO_2$ and a vertical electrode made of Ti, an information storage layer made of $Ta_2O_5$ and a vertical electrode made of Ta, an information storage layer made of $HfO_2$ and a vertical electrode made of Hf, an information storage layer made of $HfO_2$ and a vertical electrode made of CuTe, an information storage layer made of $Al_2O_3$ and a vertical electrode made of Cu or instead an information storage layer made of $Al_2O_3$ and a vertical electrode made of CuTe. Similarly, in order to obtain a phase change memory point, one could choose an information storage layer including a GeSbTe layer and a TiN layer as well as a vertical electrode made of Cu. Details concerning the recording of information at the level of a memory point PM or instead the nature of the materials used will be described hereafter.

In the component according to a first aspect of the invention, the materials composing the active electrode EA and the electrolyte layer CI are chosen so as to form an energy storage zone ZSE with the flat electrode EP. An energy storage zone ZSE is thereby obtained which may be charged and discharged by means of the active electrode EA and the flat electrode EP. More particularly, as is evoked in the Nature Communication article cited previously, in an electrochemical component the operation of which is based on the occurrence of oxidation-reduction reactions and the layout of which is of Active Electrode/Electrolyte Layer/Flat Electrode (EA/CI/EP) type, it is possible to oxidise the active electrode EA by applying a positive voltage whereas a reduction reaction on the same electrode occurs by applying a negative voltage. The oxidation can lead to the migration of ions coming from the active electrode EA in the electrolyte layer CI which induces an electromotive force (emf). This electromotive force may be considered as an energy delivered by a generator that results from a gradient in the concentration of metal ions (coming from the active electrode EA) between the active electrode EA and the flat electrode EP. The electromotive force of the oxidised state corresponds to the discharged state of a battery.

The component according to an embodiment of the invention described here implies, beyond the exploitation of the electromotive force of the oxidised state, the exploitation of the electromotive force of the reduced state. Realising a reversible switching between the values of electromotive force corresponding to the oxidised and reduced states makes it possible to use the difference in electromotive force as source of energy. The passage from a first electromotive force value to a second electromotive force value results in a change of charge state at the level of the energy storage zone ZSE. This charge state is modified by the migration of a certain quantity of ions from one electrode to the other through the electrolyte layer CI and finishes by a change in oxidation state of the ion in question. This oxidation-reduction mechanism is accompanied by an electron exchange, from or to the energy storage zone ZSE (respectively discharge or charge step) and thus makes it possible to store energy within the energy storage zone ZSE or to deliver it, for example, to an external component. This energy takes the form of a current/voltage couple. More particularly, the energy storage zone ZSE behaves as a voltage source which discharges a certain current, that is to say that it delivers a quantity of charges that correspond to a given current for a certain duration (the discharge time). The energy storage zone according to an embodiment of the invention then realises an energy storage function. It is important to note that any formation of conductive path (as is observed in resistive random access memories) would have the consequence of short-circuiting the energy storage zones ZSE making the latter non-functional. The fact of exploiting the switching between two electromotive force values to obtain energy storage capacity thus requires avoiding the creation of such a conductive path, notably by choosing suitable charge and discharge voltages. In order to enable the reactions that have been detailed above, the active electrode is thus composed of an ion source material and the electrolyte layer is a layer of an insulating material within which the ions emitted by the active electrode can diffuse. It is understood from the preceding that when the active electrode EA is composed of an ion source material of the 'capable of storing ions' type, then the material initially comprises (i.e. before the first implementation of the energy storage zone ZSE) ions stored with a view to the correct operation of the energy storage zone ZSE. Details concerning the charge and/or the discharge of the energy storage zone ZSE or instead the nature of the materials used to produce the latter will be described hereafter.

An aspect of the present invention thus makes it possible to benefit from the unused surface in components of the prior art for storing energy and thereby obtain a component comprising in an integrated manner a memory point PM and an energy storage zone ZSE, and to do so at the scale of a memory point PM (each memory point PM being associated with at least one energy storage zone ZSE).

In an embodiment illustrated in FIG. 2D, in order to improve the selection of the memory points PM and to decrease leakage currents, the vertical pillar PI further includes a selection layer (or backend selector), the selection layer being situated between the vertical electrode EV and the information storage layer CSI or on the information storage layer CSI (not illustrated). This selection layer is generally made of an oxide with high dielectric constant (or high-κ oxide).

In an exemplary embodiment, the active electrode is made of $LiCoO_2$, the electrolyte layer is made of LiPON and the flat electrode is made of platinum. The storage of energy takes place in the energy storage zone by the electrodeposition of ions from the active electrode EA on the flat electrode EP, after diffusion through the electrolyte layer CI.

In one embodiment, the flat electrode EP comprises a first layer EP1 and a second layer EP2, the first layer EP1 facing the active electrode EA and being constituted of a material, the second layer EP2 and the vertical pillar PI forming the memory point PM and the first layer EP1, the electrolyte layer CI and the active electrode EA forming the energy storage zone ZSE. In one exemplary embodiment, the active electrode EA is made of $LiCoO_2$, the electrolyte layer is made of LiPON, the first layer EP1 of the flat electrode EP is made of Si and the second layer EP2 of the flat electrode EP is made of Pt. The storage of energy takes place in the energy storage zone ZSE by the migration of ions from the active electrode EA to the first layer EP1 of the flat electrode EP. In the case where an energy storage zone ZSE includes two sources of ions, it is only important that one of the two is able to supply ions during the first implementation of the energy storage zone ZSE. Thus, if the energy storage zone ZSE includes at least one source of ions of 'capable of storing ions' type, then this source of ions can initially (i.e. before the first implementation of the energy storage zone) not comprise any ions providing the second source of ions does comprise ions. In the above example, the first layer EP1 of the flat electrode EP is constituted of an ion source material of 'capable of storing ions' type: silicon. Initially, this silicon may not comprise any ions, the ions necessary for the correct operation of the energy storage zone ZSE being provided by the active electrode EA also composed of an ion source material: $LiCoO_2$ which is capable of supplying lithium ions. In any event, once the energy storage zone ZSE is implemented, $Li^+$ ions will also be present in the first layer EP1 of the flat electrode EP.

In an embodiment, in order to ensure that the filament between the flat electrode EP and the vertical electrode EV forms at the level of the second layer EP2, the first layer EP is ten times less conductive than the second layer EP2, or even one hundred times less conductive than the second layer EP2. In an alternative or complementary embodiment, the first layer EP1 is not in contact with the vertical pillar PI. Such a configuration may be obtained by a selective etching method. For example, if the first layer EP1 of the flat electrode EP is made of aluminium and the second layer EP2 of the flat electrode EP is made of platinum, then a wet etching based on $H_3PO_4$ will etch the first layer EP1 without etching the second layer EP2 such that when the vertical pillar PI is next formed, an empty space is obtained between the vertical pillar PI and the first layer EP1. In an alternative embodiment, the first layer EP1 of the flat electrode EP is separated from the vertical pillar PI by an insulating material. To do so, after the selective wet etching described above and before the formation of the vertical pillar PI, a step of conformal deposition of an insulator is carried out on the face of the flat electrode EP intended to be facing the vertical pillar PI then a step of anisotropic etching is carried out so that only an oxide layer remains at the level of the first layer EP1. Thus, once the vertical pillar has been formed, the latter is separated from the first layer of the flat electrode by an insulating layer preventing the formation of a filament between the first layer and the vertical electrode of the pillar.

In an embodiment, the component comprises a plurality of flat electrodes EP, a plurality of electrolyte layers CI and a plurality of active electrodes EA. In addition, each flat electrode EA of the plurality of flat electrodes EA is laid out so as to form a memory point PM with the information storage layer CSI and the vertical electrode EV of the vertical pillar PI. Moreover, each active electrode EA of the plurality of active electrodes EA is separated from each adjacent flat electrode EP of the plurality of flat electrodes EP by an electrolyte layer CI of the plurality of electrolyte layers CI so as to form an energy storage zone ZSE. Thus, a memory cell CM is obtained including a stack of several memory points PM, but also a stack of several energy storage zones ZSE forming a nano-battery NB. Hereafter, a memory cell CM designates the assembly comprising the memory points PM as well as the nano-battery NB. In other words, the nano-battery NB is comprised in the memory cell CM.

In a particularly beneficial embodiment, the number of flat electrodes EP is equal to n (n being an integer) and the number of active electrodes EA is equal to n+1. In other words, an active electrode EA can form at the level of its first surface a first energy storage zone ZCE with the electrolyte layer CI and the flat electrode EP facing the first surface as well as a second energy storage zone ZCE with the electrolyte layer CI and the flat electrode EP facing the second surface of the active electrode EA. Thus, the device according to a first aspect of the invention includes, for each memory point PM, two energy storage zones ZSE.

Figure 3B:
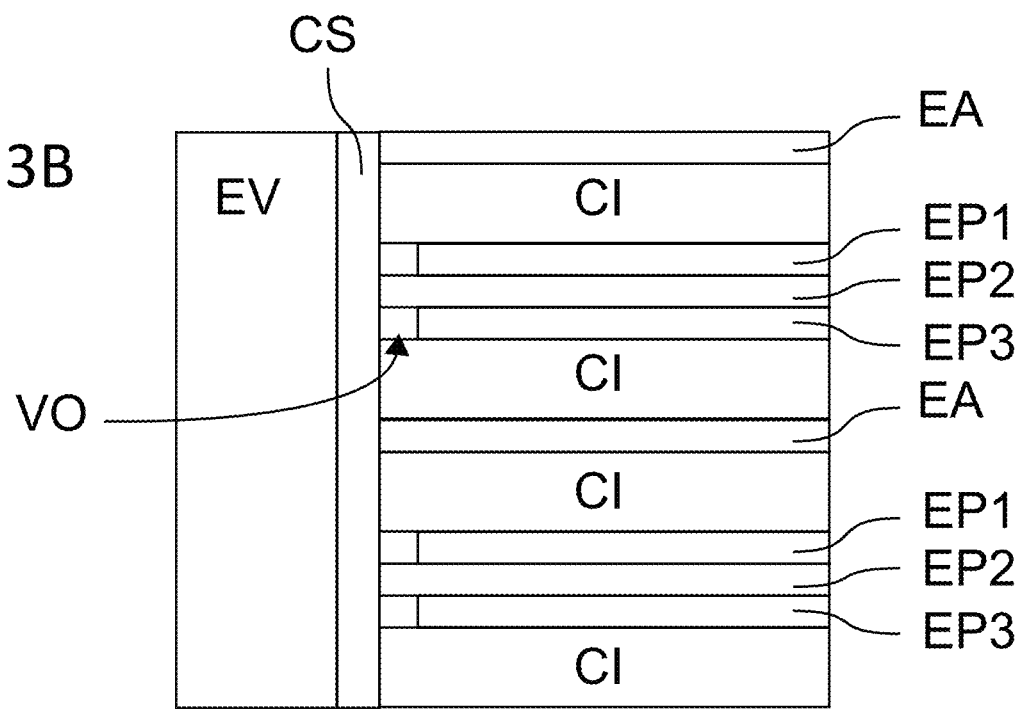

In an embodiment illustrated in FIG. 3A, each flat electrode EP comprises a third layer EP3, the third layer EP3 facing an active electrode EA and being constituted of an ion source material. Thus, each flat electrode EP of the plurality of flat electrodes EP comprises a first layer EP1 made of ion source material separated from a first active electrode EA of the plurality of active electrodes by a first electrolyte layer CI of the plurality of electrolyte layers CI, a second layer EP2 forming the memory point PM with the vertical pillar PI and a third layer EP3 made of an ion source material separated from a second active electrode EA of the plurality of active electrodes EA by a second electrolyte layer CI of the plurality of electrolyte layers CI. As described previously, it is important to avoid the formation of a filament between the vertical pillar PI and the first layer EP1 or the third layer EP3. To do so, in an embodiment, the first layer EP1 and the third layer EP3 are ten times less conductive than the second conducting layer EP2, or even one hundred times less conductive than the second layer EP2. In an alternative or complementary embodiment illustrated in FIG. 3B, the first layer EP1 and/or the third layer EP3 of each flat electrode EP are separated from the vertical pillar PI by a space VO, in other words, they are not in contact with the vertical pillar PI. Alternatively, the first layer EP1 and/or the third layer EP3 of each flat electrode EP are separated from the or from each vertical pillar PI by an insulating material. Thus, during operations of writing memory points PM, it is ensured that the filament formed between the vertical pillar PI and the flat electrode EP is formed between the second layer EP2 of the flat electrode EP and the vertical pillar PI. Examples of methods making it possible to arrive at such configurations, moreover known to those skilled in the art, have been given previously and thus will not be repeated here.

In an embodiment, a component according to a first aspect of the invention includes a plurality of vertical pillars PI, each vertical pillar PI being laid out so as to form a memory point PM with each flat electrode EP. It is thereby possible to obtain a component comprising a plurality of memory cells CM (and thus nano-batteries NB) each memory cell CM comprising one or more memory points PM (and thus each nano-battery NB including one or more energy storage zones ZSE).

In an embodiment, the vertical electrode EV is of cylindrical shape and includes a first and a second surface parallel to each other as well as a third surface, designated lateral surface or cylindrical surface. In this embodiment, the information storage layer CSI covers the lateral surface of the vertical electrode EV. In an embodiment, the cylinder is a straight circular cylinder. As a reminder, a cylinder is a regulated surface of which the generators are parallel, that is to say a surface in space, designated cylindrical surface, constituted of parallel straight lines. By extension, cylinder also designates the solid delimited by a cylindrical surface and by two strictly parallel planes. If these planes are perpendicular to the generators, it is said that the cylinder is straight.

Figure 4:
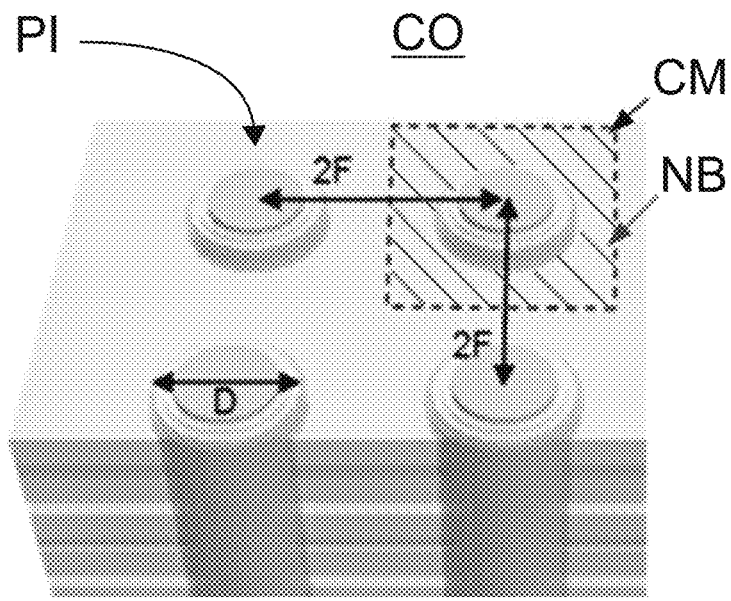
FIG. 4 illustrates the notions of distance between vertical electrodes, diameter of the vertical pillars and the surface of a memory cell and a nano-battery.

As illustrated in FIG. 4, it is possible to define a surface unit of the memory cell CM and a surface unit of the nano-battery NB (which corresponds to the surface area of the memory cell CM less the surface area occupied by the vertical pillar PI). In addition, the vertical pillar PI defines a cylinder of diameter D, each cylinder of the plurality of cylinders being distant from the following cylinder by a distance 2F, the distance being measured between the axes of revolution of the cylinders. From these two parameters, it is possible to define the surface area of a memory cell CM as being equal to $4F^2$ and the surface area of the nano-battery NB as being equal to $4F^2 - \pi D^2/4$.

Figure 5:
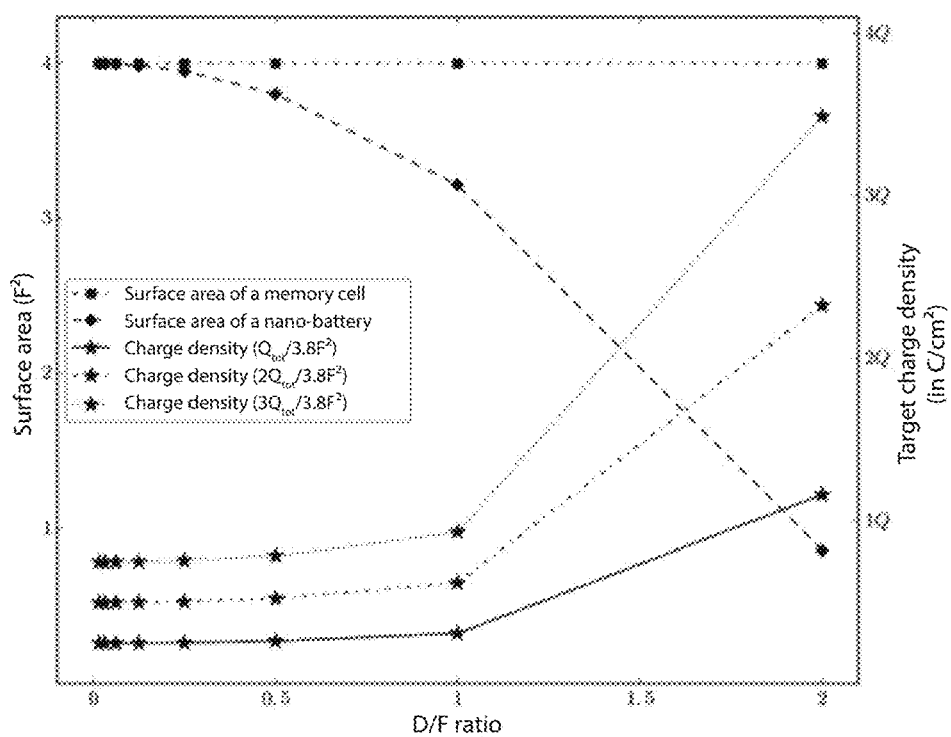
FIGS. 5, 6A and 6B illustrate the evolution of the properties of a component according to a first aspect of the invention as a function of the parameters of the component.

As illustrated in FIG. 5, it is possible to make these two parameters vary as a function of the functionality (storage of information or storage of energy) that it is wished to favour. In this figure is represented the charge density corresponding to three charge objectives ($Q_{tot}$, 2 $Q_{tot}$ and 3 $Q_{tot}$) per energy storage zone ZSE, the surface area of the memory cell CM and the surface area of the nano-battery NB as a function of the ratio D/F. The configurations corresponding to points situated on the right of the graph minimise the surface area of the nano-battery NB (and thus the energy storage zone(s) ZSE) and are thus configurations more favourable to the storage of information compared to configurations corresponding to the points on the left of the graph which tends to maximise the surface area of the nano-battery NB. As will now be seen, these parameters may be modulated in different ways.

Figure 6A:
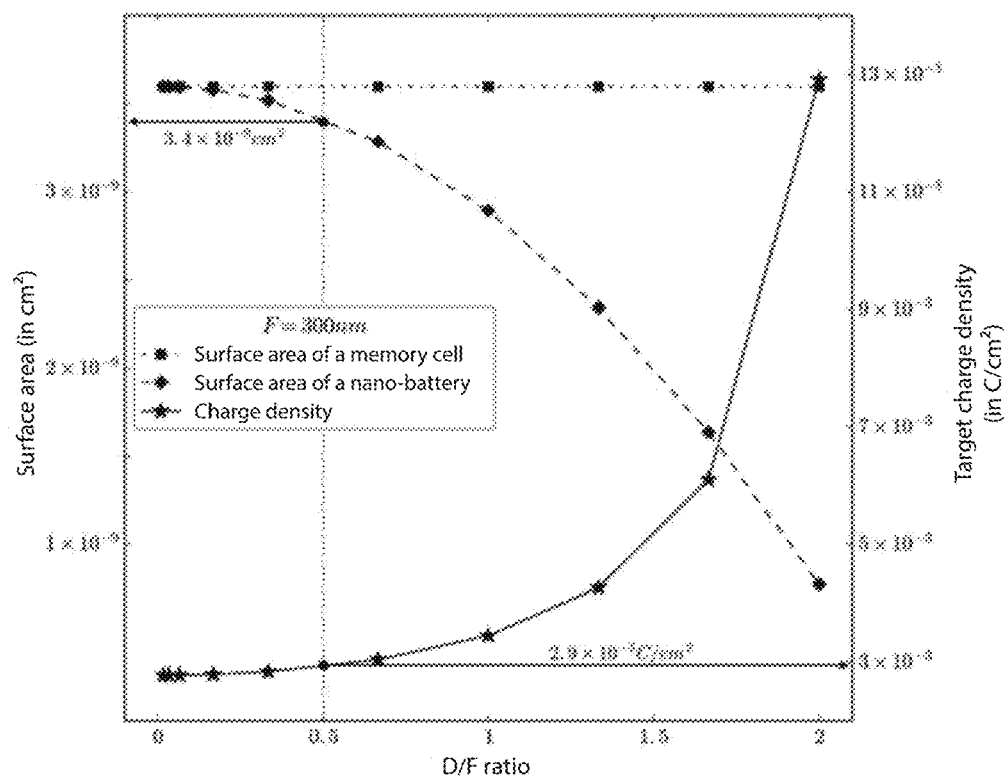
Figure 6B:
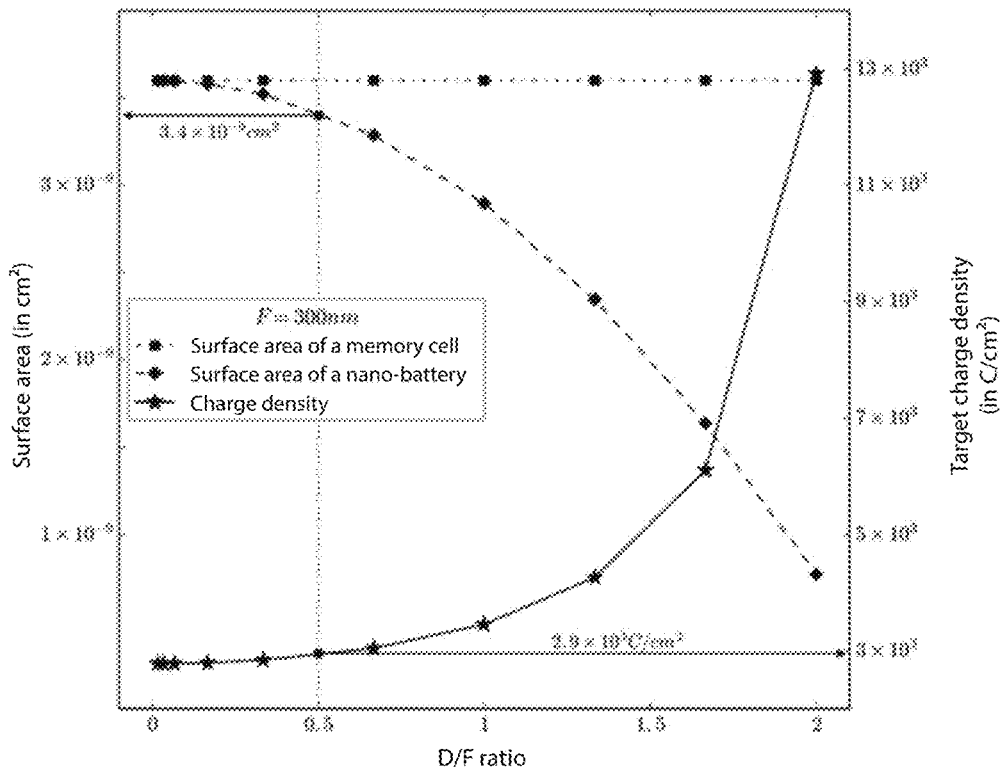

When the distance between vertical pillars 2 F is set (in other words, the density of memory cells CM per surface unit is set), it is possible to vary the diameter D of the vertical pillars PI in order to adapt the geometry of the component as a function of needs, for example in terms of energy storage. FIGS. 6A and 6B represent the surface area of a memory cell CM, the surface area of a nano-battery NB as well as the charge density required for one (FIG. 6A) or more (FIG. 6B) operations of initialisation or re-initialisation on a memory point PM as a function of the ratio D/F for a component of which the distance between pillars F is equal to 300 nm. The target charge density is defined by $Q_{tot}$/(surface area of a nano-battery NB) where $Q_{tot}$ is the total target charge to store in each energy storage zone ZSE of a nano-battery NB. As detailed previously, each memory point PM is associated with at least one energy storage zone ZSE. In the beneficial configuration including a plurality of flat electrodes EP and a plurality of active electrodes EA, each memory point PM may be associated with two energy storage zones ZSE. Hereafter, the configuration considered is that in which each memory point PM is associated with two energy storage zones ZSE.

In FIG. 6A, the energy to store in each energy storage zone ZSE is set as a function of an objective consisting in being able to carry out two operations of initialisation or re-initialisation of a memory point PM, which corresponds in our example to the electrical charge $Q_{tot}$ required to produce a pulse of 100 μA for 100 ns i.e. $Q_{tot}$=10 pC (it is here assumed that each memory point PM is associated with two energy storage zones ZSE). By plotting the target charge density as a function of the ratio D/F as is shown in FIG. 6A, it is possible to choose a diameter D, as a function of the desired charge density. In the example of FIG. 6A, a desired charge density equal to 2.9 mC/cm² corresponds to a surface area of nano-battery NB of $3.4 \times 10^{-9}$ cm², that is to say a diameter D of 150 nm. It is thus possible to determine the diameter D as a function of the desired charge density.

In FIG. 6B, the energy to store in each energy storage zone ZSE is set as a function of an objective consisting in being able to carry out $2 \times 10^6$ operations of initialisation or re-initialisation of a memory point PM, which corresponds in our example to the electrical charge $Q_{tot}$ required to produce $10^6$ pulses of 100 μA for 100 ns i.e. $Q_{tot}$=10 μC (it is assumed here that each memory point PM is associated with two energy storage zones ZSE). By plotting the target charge density as a function of the ratio D/F as is shown in FIG. 6B, it is possible to determine the diameter D as a function of the desired charge density. In the example of FIG. 6B, a desired charge density equal to $2.9 \times 10^3$ C/cm² corresponds to a surface area of nano-battery NB of $3.4 \times 10^{-9}$ cm$^2$, that is to say a diameter D of 150 nm. The preceding results are summarised in table 1 below.

TABLE 1

| Example | Two memory cycles | $2 \times 10^6$ memory cycles |
|---|---|---|
| F | 300 nm | 300 nm |
| D | 150 nm | 150 nm |
| Surface area of the nano-battery | $3.4 \times 10^{-9}$ cm$^2$ | $3.4 \times 10^{-9}$ cm$^2$ |
| $Q_{tot}$ | 10 pC | 10 uC |
| Desired charge density | 2.9 mC/cm$^2$ | $2.9 \times 10^3$ C/cm$^2$ |

It is also possible, for a given diameter D of the vertical pillars PI, to vary the distance between electrodes F. For example, an objective consisting in being able to carry out two operations of initialisation or re-initialisation of a memory point PM (i.e. the electrical charge $Q_{tot}$ per energy storage zone ZSE required to produce a pulse of 100 µA for 100 ns i.e. $Q_{tot}$=10 pC) with a diameter D set at 300 nm and a desired charge density equal to 73 mC/cm$^2$ is obtained with a distance F between vertical electrodes EV of 600 nm. It is obviously possible to reduce the diameter D to decrease the charge density required to attain the objective in terms of stored energy. However, as will be described hereafter, the diameter D cannot be reduced indefinitely due to manufacturing constraints, notably in terms of aspect ratio. The diameter D is thus comprised between an upper value equal to 2F for which the surface area dedicated to the storage of the energy is minimal and a lower value set by the manufacturing limits for which the surface area dedicated to the storage of energy is maximal.

Figure 7:
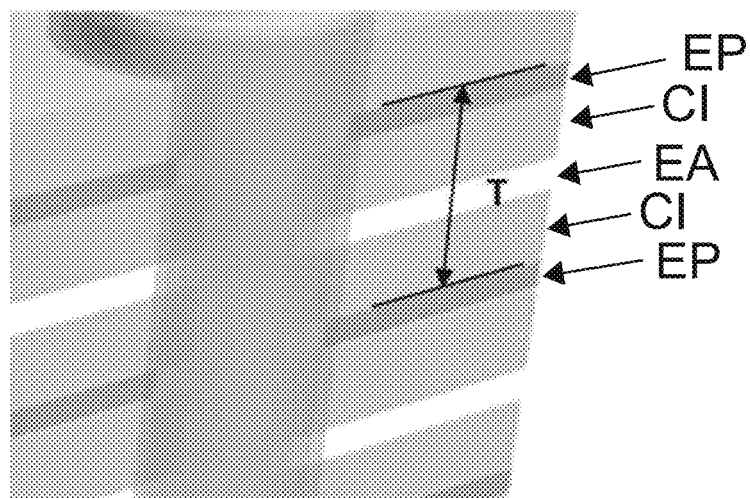
FIG. 7 illustrates the notion of thickness in a component according to a first aspect of the invention.
Figure 8A:
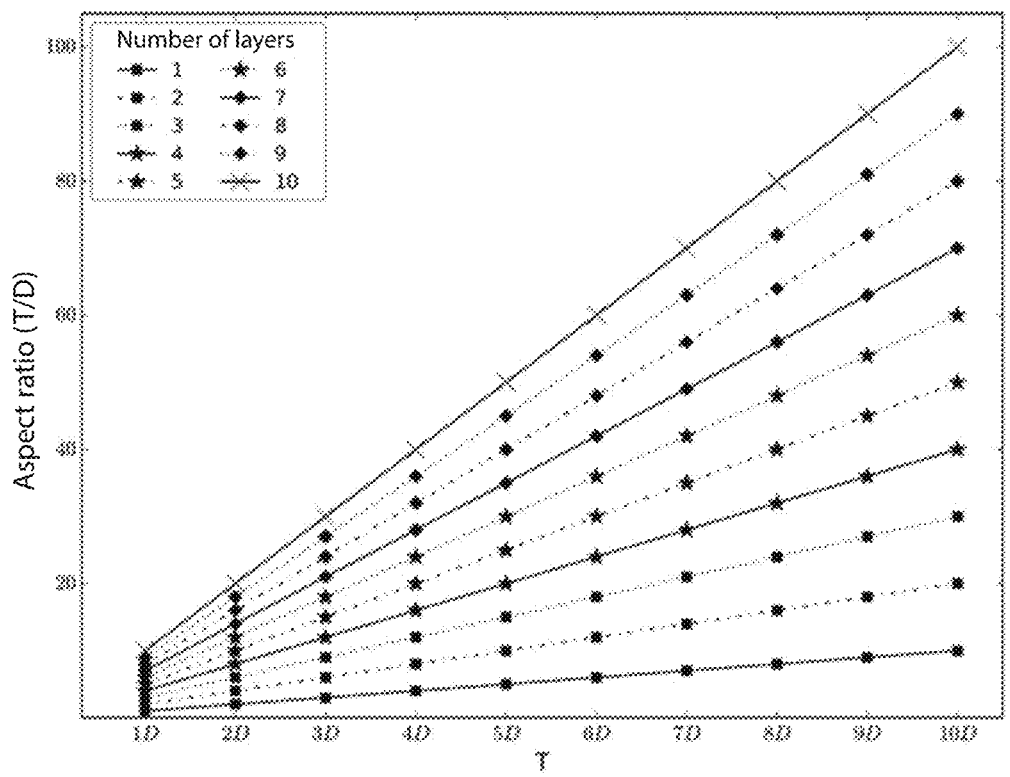
FIGS. 8A and 8B illustrate the evolution of the aspect ratio as a function of the number of electrolyte layers and the thickness of the layers.
Figure 8B:
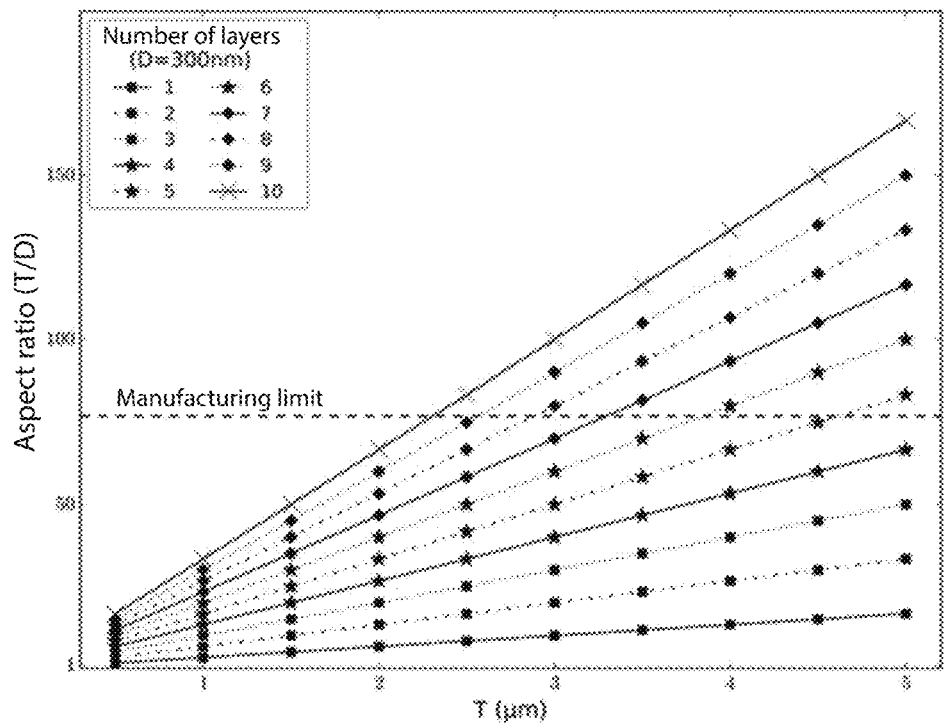

When the parameters F and D are set, it is possible to vary the thickness T of the electrolyte layer CI between the flat electrode EP and the active electrode EA where the thickness is defined as the distance separating two flat electrodes EP, as is illustrated in FIG. 7. Generally speaking, a higher thickness T makes it possible to store more energy (the material composing the electrolyte layer CI having a maximum volume charge density dictated by the number of ion insertion sites available per unit volume of material), but decreases the number of memory points PM per memory cell CM. In order to measure the influence of this parameter, FIG. 8A presents the value of the aspect ratio T/D (thickness T over diameter D—on the Y-axis) as a function of the thickness of the layer T (on the X-axis) and the number of electrolyte layers CI (each curve corresponds to a given number of electrolyte layers CI). The higher the thickness T, the higher the aspect ratio for a given number of layers. However, for a given thickness T, it is not generally possible to go below a minimum diameter D corresponding to the manufacturing limits in terms of aspect ratio. This is illustrated in FIG. 8B in which the limit aspect ratio is substantially equal to 77. By considering a diameter D equal to 300 nm, this signifies that for a thickness T of 2 µm, it is possible to envisage a structure with ten electrolyte layers CI whereas for a thickness T of 2.5 µm, the number of electrolyte layers CI will be limited to nine layers due to manufacturing constraints. The limit value of the aspect ratio depends on the manufacturing method employed to obtain the component according to a first aspect of the invention, and in particular the vertical electrode EV. Thus, for a given diameter D, a distance F and an objective $Q_{tot}$, the corresponding charge density may be determined. The latter makes it possible to calculate the necessary thickness T, the latter making it possible in its turn to determine, taking account of the limit at the level of the aspect ratio, the maximum number of electrolyte layers (and thus the number of memory points PM and energy storage zones ZSE per memory cell CM).

If it is not possible to reach the target charge density, it may also be envisaged to recharge (in other words refresh the charge) the energy storage zone ZSE more regularly. For example, if the charge density necessary for $2 \times 10^6$ operations cannot be reached, it is possible to put in place a step of charging the energy storage zone ZSE every $2 \times 10^4$ operations for example. This refreshing can act as a complement to that making it possible to take account of the electrical perturbation generated by the operations carried out on the memory points PM (which will be described hereafter) or as a replacement for the latter.

Figures 9A, 9B:
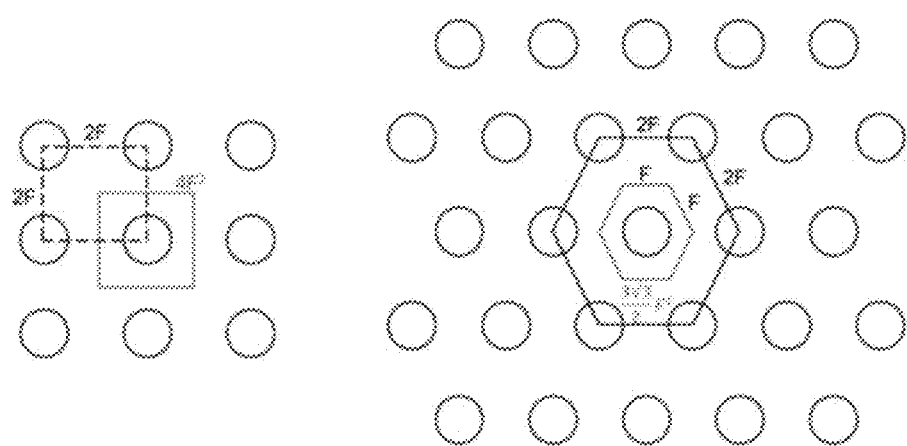
FIGS. 9A and 9B illustrate two alternative arrangements of vertical pillars in a device according to a first aspect of the invention.

In addition to the different parameters mentioned previously, it is also possible to vary the arrangement of the vertical pillars EV with respect to each other. FIG. 9A illustrates a first arrangement in which the projection of the plurality of vertical pillars PI onto a plane parallel to the planes formed by the flat electrodes EP forms an array of which the unit cell is a square cell. FIG. 9B illustrates for its part a second arrangement in which the projection of the plurality of vertical pillars PI onto a plane parallel to the planes formed by the flat electrodes EP forms an array of which the unit cell is a lozenge-shaped cell. The structure of FIG. 9B proposes a density of vertical pillars PI (and thus of memory points PM) higher than the structure of FIG. 9A and favours the information storage function to the detriment of the energy storage function compared to the structure of FIG. 9A. One or the other of the arrangements could thus be chosen depending on whether it is wished to favour the storage of information or the storage of energy. Other unit cells may obviously be envisaged.

As has just been described, it is possible to modify the structural parameters of a component according to a first aspect of the invention and to take account of the main functionality for which it is intended in the choice of these parameters. These variations are not limited however to solely geometric properties (arrangements and dimensions), but also to the choices in the materials used. In an embodiment, the flat electrode EP (or the second layer EP2 of the flat electrode EP when the latter is multilayer) is made from an inert metal such as titanium nitride TiN, platinum Pt, tungsten W or an alloy including all or part of these elements. In an embodiment, the active electrode EA is made from an ion source metal such as copper Cu, silver Ag, lithium Li, gold Au or an alloy including all or part of these elements (the same holds for the first layer EP1 and the third layer EP3 of the flat electrode EP when the latter is multi-layer). In an embodiment, the electrolyte layer CI is made from an insulator through which the ions can diffuse such as silicon oxide SiO$_2$, hafnium oxide HfO$_2$, tantalum oxide Ta$_2$O$_5$. In an embodiment, the information storage layer SCI includes a layer made from an ion source metal such as copper Cu, silver Ag or an alloy including all or part of these elements, or instead a source of vacancies such as titanium Ti, hafnium Hf or an alloy including all or part of these elements.

Figure 10:
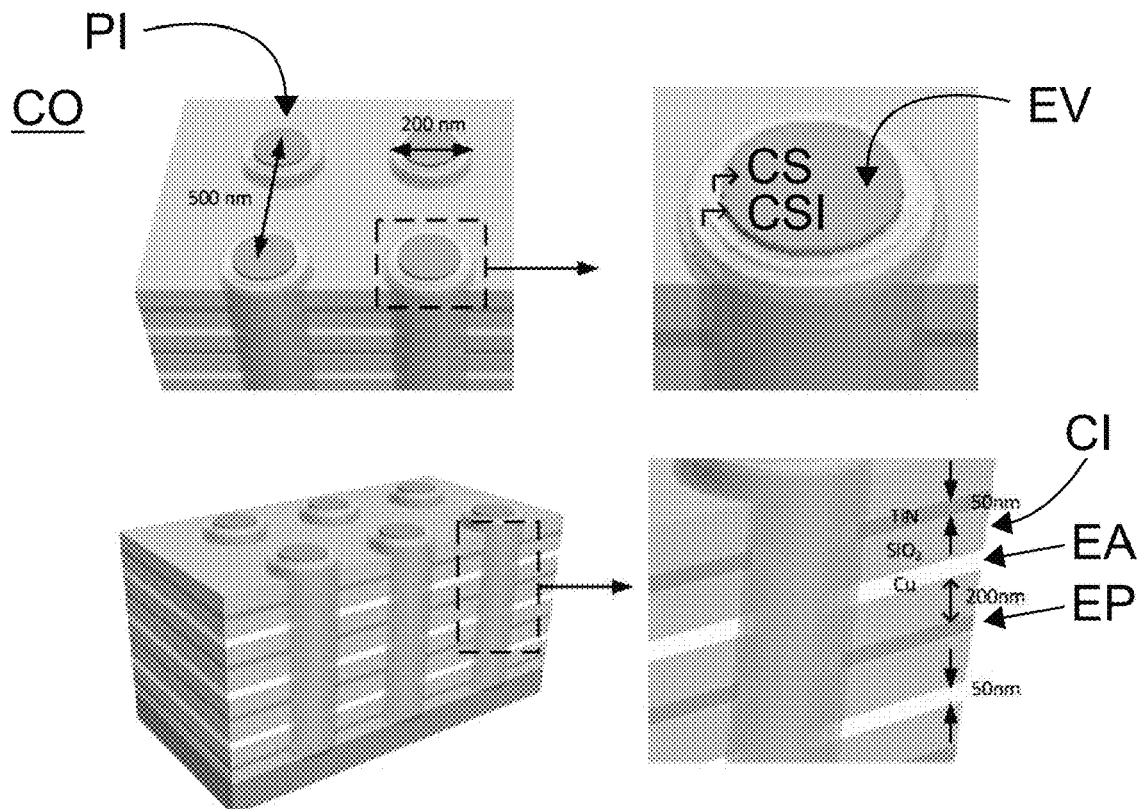
FIGS. 10 and 11 illustrated two exemplary embodiments of a component according to a first aspect of the invention.

A first exemplary embodiment of a component according to a first aspect of the invention is illustrated in FIG. 10. This first example is favourable to memory performances. Indeed, it integrates a relatively low thickness of electrolyte (SiO$_2$) (200 nm), enabling a moderate aspect ratio of the stack. It is thus possible to integrate more memory points PM, thus greater memory density. In this component, the distance 2 F separating two vertical pillars PI is equal to 500 nm (F=250 nm) and the diameter D of the vertical pillar PI is equal to 200 nm. In addition, the projection of the vertical pillars PI onto a plane parallel to the planes formed by the flat electrodes EP forms an array of square unit cells. The information storage layer CSI comprises a layer of titanium Ti of a thickness equal to 5 nm and a layer of hafnium oxide $HfO_2$ of a thickness of 10 nm. The selection layer SC has a thickness less than 50 nm and is situated between the layer of hafnium oxide $HfO_2$ of the information storage layer CSI and the vertical electrode EV, the selection layer SC covering a surface of the vertical electrode EV. The vertical electrode EV is for its part constituted of titanium nitride TiN. Moreover, the flat electrodes EP are constituted of titanium nitride TiN and have a thickness of 50 nm. The active electrodes EA are for their part composed of copper Cu and also have a thickness of 50 nm. Finally, the electrolyte layers CI are composed of silicon oxide $SiO_2$ and each have a thickness of 200 nm.

Figure 11:
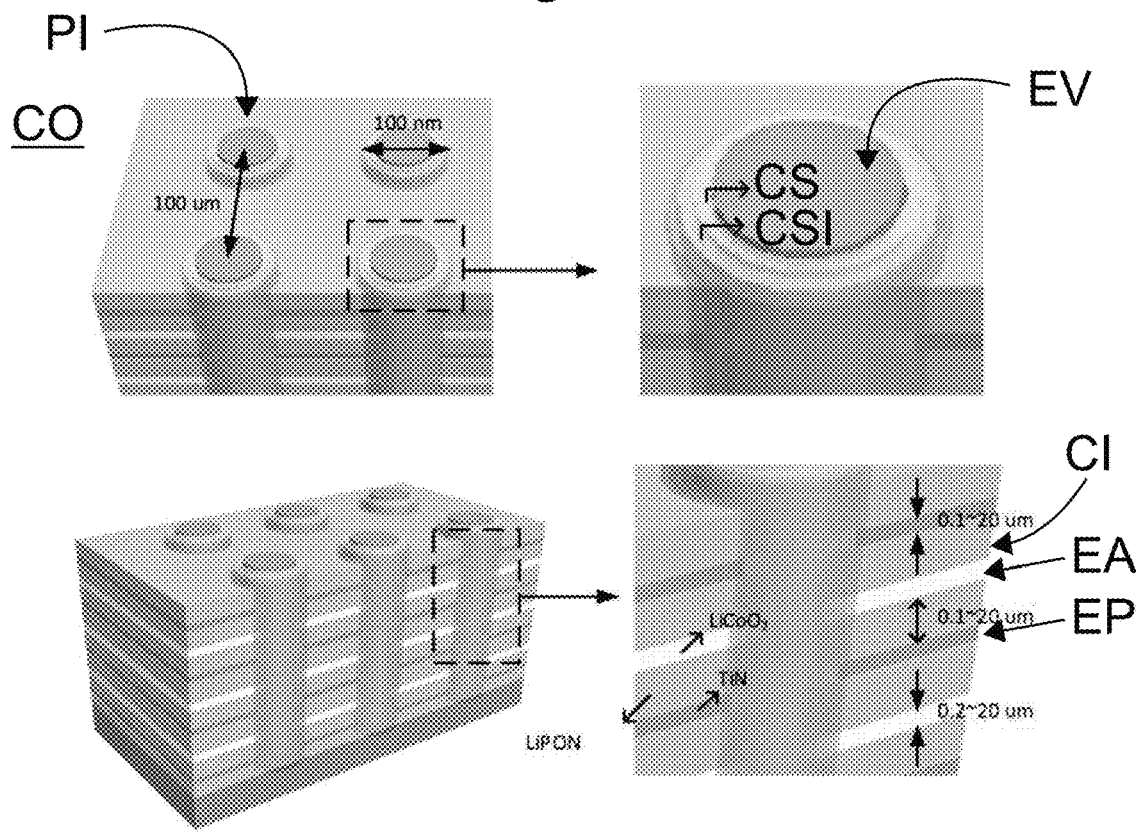

A second exemplary embodiment of a component according to a first aspect of the invention is illustrated in FIG. 11. This second example is favourable to the storage of energy, because it integrates a stack of information storage zones making it possible to store more energy. On the other hand, since the thickness of the electrolyte and the active electrode is greater than in the first case (up to 20 µm in the present case), the aspect ratio is very high, which is to the detriment of the number of memory points PM that can be integrated, thus a lower memory density. In this component, the distance 2 F is equal to 100 µm (F=50 µm) and the diameter D is equal to 100 nm. In addition, the projection of the vertical pillars PI onto a plane parallel to the planes formed by the flat electrodes EP forms an array of square unit cells. The information storage layer CSI comprises a layer of titanium Ti of a thickness equal to 5 nm, and a layer of hafnium oxide $HfO_2$ of a thickness of 10 nm. The selection layer SC has a thickness less than 20 nm and is situated between the layer of hafnium oxide $HfO_2$ of the information storage layer CSI and the vertical electrode EV, the selection layer CS covering a surface of the vertical electrode EV. The vertical electrode EV is constituted of titanium nitride TiN. Moreover, the flat electrodes EP are constituted of titanium nitride TiN and have a thickness comprised between 0.2 and 20 µm. The active electrodes EA are for their part composed of $LiCoO_2$ and have a thickness comprised between 0.1 and 20 µm. Finally, the electrolyte layers CI are composed of dielectric LiPON and each have a thickness comprised between 0.1 and 20 µm. It is to be noted that in this case, the storage of energy is ensured by the $LiCoO_2$ layer. Also, only an increase in this layer makes it possible to optimise the storage capacity.

As indicated by the D/L ratios, the diameter of the pillars D over the inter-pillar distance F of each component, the first component favours the storage of information compared to the second component. This trend is further accentuated by the choice of a thicker electrolyte layer CI in the case of the second component favouring the storage of energy to the detriment of the storage of information. These two examples make it possible to illustrate how it is possible to vary different parameters of a component according to a first aspect of the invention as a function of the functionality that it is wished to favour.

It will be appreciated that other factors than the dimensions or the materials used may be chosen so as to optimise the properties of a component according to the invention. It is for example important to select the etching technique making it possible to obtain an aspect ratio that is as high as possible. The use of a selective etching method makes it possible for example to obtain a thicker information storage layer CSI which reduces the leakage current between the active electrode(s) EA and the vertical electrode EV, the layer CSI behaving as an insulator between these two types of electrodes EA, EV.

Figure 12A:
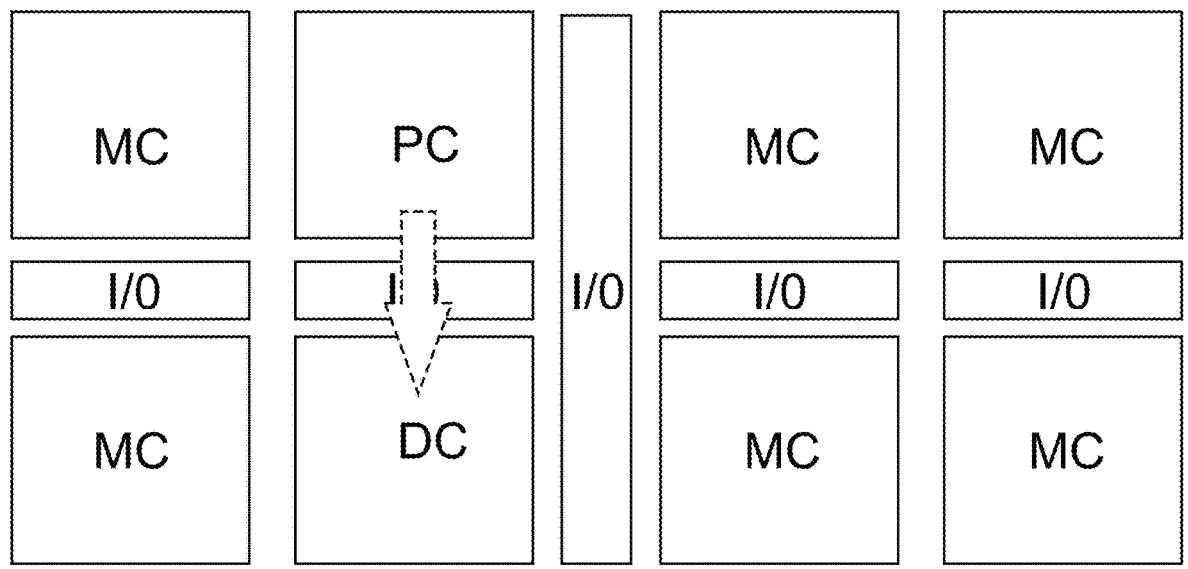
FIGS. 12A and 12B illustrate a device according to a second aspect of the invention and a method according to a third aspect of the invention.
Figure 12B:
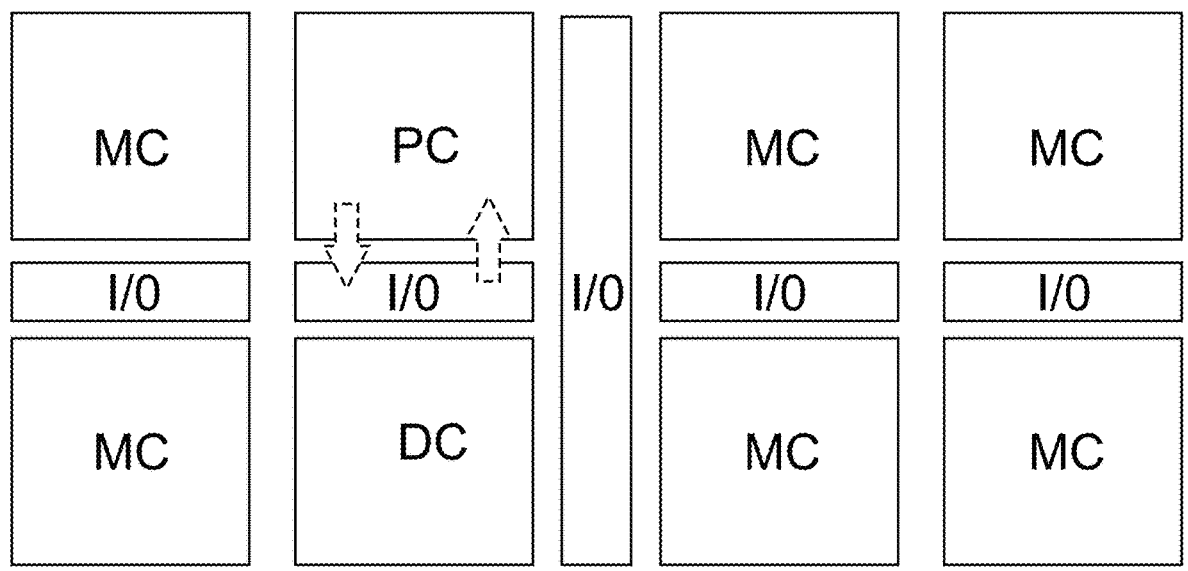

In a second aspect of the invention illustrated in FIGS. 12A and 12B, the invention relates to a semiconductor device including at least one first component PC, according to a first aspect of the invention. The device may also include additional components MC, DC. In one embodiment, the materials and the dimensions of the first component PC are chosen so as to favour the storage of energy. In an embodiment illustrated in FIG. 12A, the first component PC is configured to supply energy to a second component DC. In an embodiment, the second component DC is a component according to a first aspect of the invention, for example a component according to a first aspect of the invention of which the materials and the dimensions are chosen so as to favour the storage of information. In an embodiment illustrated in FIG. 12B, the device according to a second aspect of the invention comprises an input/output I/O system, the input/output I/O system being configured so that the first component PC uses the energy stored in the nano-batteries NP of the first component PC to supply the memory cells CM of the first component PC.

In other words, a component CO according to a first aspect of the invention, once integrated in a device DI, can supply itself with energy and/or supply a second component DC, the second component DC which can be a component according to a first aspect of the invention or any other component requiring an energy supply. Thus, a component CO according to a first aspect of the invention may be used either as component intended for the storage of information, or as component intended for the storage of energy or instead a component intended both for the storage of information and for the storage of energy. It is thus possible to use the same component within a device for storing information and/or energy in a perfectly integrated manner.

To do so, a third aspect of the invention relates to a method for using a semiconductor device DI comprising a first and a second semiconductor component CO according to a first aspect of the invention. The method according to a third aspect of the invention comprises a step in which the first semiconductor component PC is used for the storage of information; and a step in which the second semiconductor component DC is used for the storage of energy.

Figure 13A:
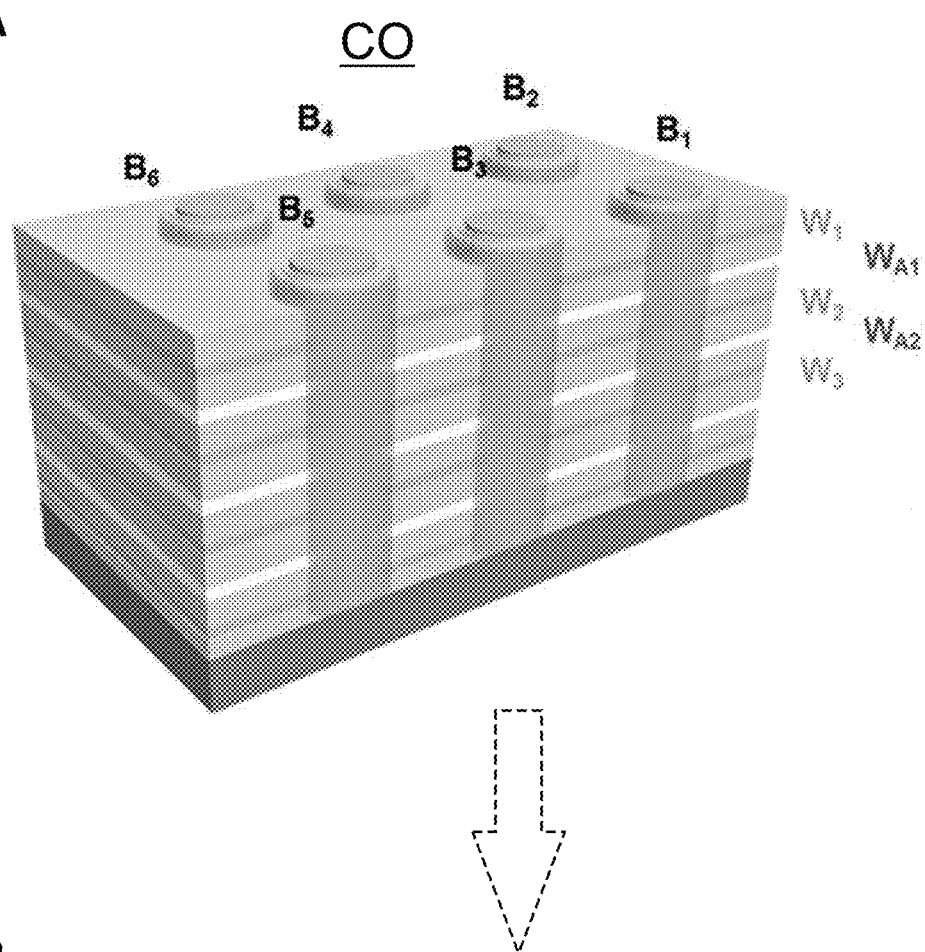
FIGS. 13A and 13B illustrate an equivalent electrical diagram of a component according to a first aspect of the invention.
Figure 13B:
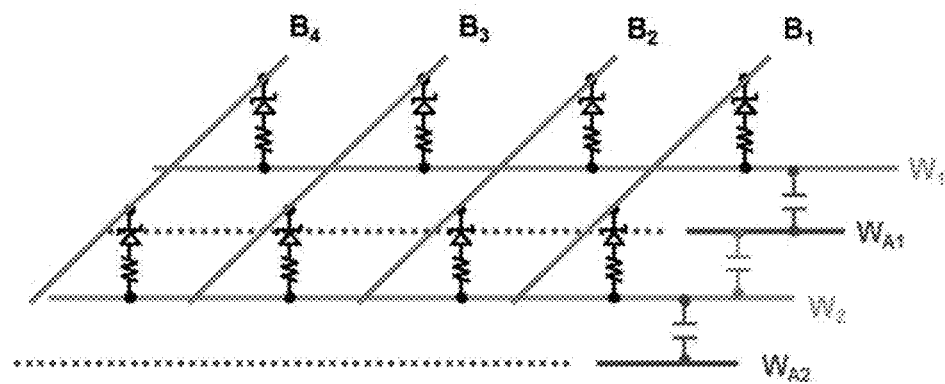

FIGS. 13A and 13B illustrate an equivalent electrical diagram of a component according to a first aspect of the invention. The vertical electrodes EV are represented by the references $B_i$ with i an integer comprised between 1 and 4. The flat electrodes EP are represented by the references $W_i$ with i an integer equal to 1 or 2. Finally, the active electrodes EA are represented by the references $W_{Ai}$ with i an integer equal to 1 or 2. Each flat electrode EP is electrically connected to each vertical electrode EV by a Zener diode (representing the selection layer SC) in series with a resistance (representing the information storage layer CSI). In addition, each active electrode EA is connected to each adjacent flat electrode EP by a capacitance (representing the energy storage zone ZSE). On the other hand, the active electrodes EA are not electrically connected to the vertical electrodes EV due to the information storage layer CSI which behaves as an insulator between the active electrodes EA and the vertical electrodes EV, no filament being formed at the level of the latter.

In order to be able to implement a step in which a semiconductor component according to a first aspect of the invention is used for the storage of information and/or for the storage of energy, a set of well-defined voltages is applied so as to initialise/re-initialise the memory points PM or charge/discharge the energy storage zones ZSE. Table 2 describes the different voltages corresponding to the different operations with $V_{set}$ the voltage that it is necessary to apply to a memory point PM to initialise (write an information) the latter, $V_{reset}$ the voltage that it is necessary to apply to a memory point PM to re-initialise (erase an information) the latter, $V_{charge}$ the voltage that it is necessary to apply to an energy storage zone ZSE to charge and $V_{discharge}$ the voltage that it is necessary to apply to an energy storage zone ZSE to discharge it. In table 2 and FIGS. 14A to 15B, the letter G signifies that the potential is maintained to earth and the letter F signifies that the potential is floating. In one embodiment, the initialisation voltage $V_{set}$ is equal to 1V, the re-initialisation voltage $V_{reset}$ is equal to –1V, the charge voltage $V_{charge}$ is equal to –1.5V and the discharge voltage $V_{discharge}$ is equal to 0V.

TABLE 2

| ⅓$V_{set}$ mode | | $B_1$ | $B_n$ | $W_1$ | $W_n$ | $W_{A1}$ | $W_{An}$ |
| --- | --- | --- | --- | --- | --- | --- | --- |
| Initialisation | Short | $V_{set}$ | ⅓$V_{set}$ | G | ⅔$V_{set}$ | F | F |
| Re-initialisation | time | $V_{reset}$ | ⅓$V_{reset}$ | G | ⅔$V_{set}$ | F | F |
| Charge | Long | F | F | G | F | $V_{charge}$ | F |
| Discharge | time | F | F | $V_{discharge}$ | F | $V_{discharge}$ | F |

Figure 14A:
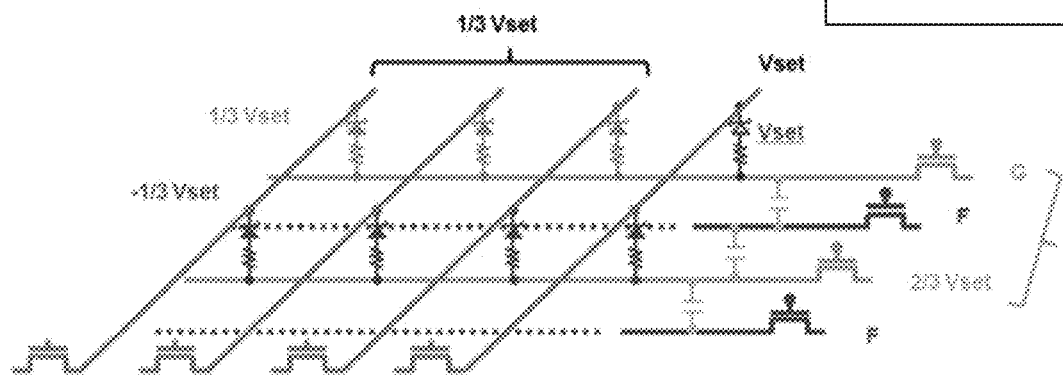
FIGS. 14A and 14B illustrate the operations of initialisation and re-initialisation of the memory points of a component according to a first aspect of the invention.
Figure 14B:
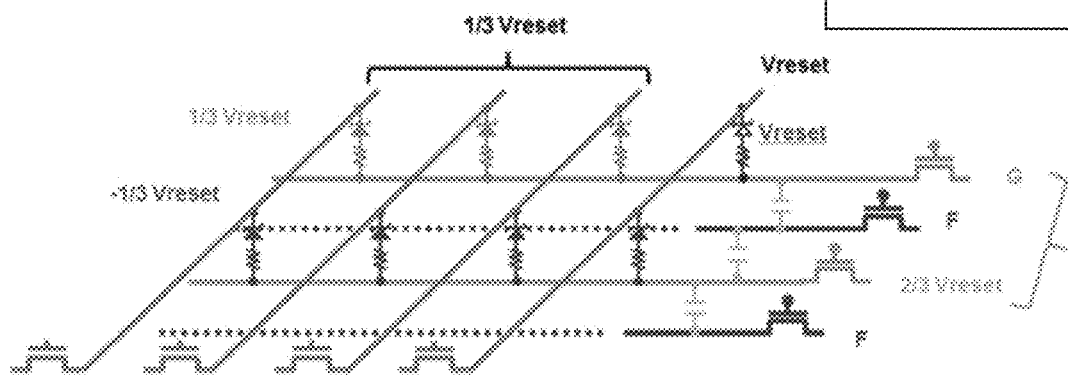

FIGS. 14A and 14B illustrate the operations of initialisation and re-initialisation of memory points PM. As illustrated in FIG. 14A, in order to initialise a memory point PM, the potential of the flat electrode EP corresponding to the memory point PM is maintained to earth whereas the vertical electrode EV corresponding to the memory point PM is polarised to a voltage $V_{set}$. During this operation of initialisation, the other vertical electrodes EV are polarised to a voltage ⅓$V_{set}$, the polarisation of the active electrodes EA is floating, the other flat electrodes EP being polarised to a voltage ⅔$V_{set}$. This thus signifies that during this operation, the target memory point PM sees a voltage $V_{set}$ applied whereas the other memory points PM see a voltage equal to ⅓$V_{set}$ applied for the memory points PM having in common with the target memory point PM the flat electrode EP or the vertical electrode EV and –⅓$V_{set}$ for the other memory points PM. As illustrated in FIG. 14B, in order to re-initialise a memory point PM, the polarisation of the flat electrode EP corresponding to the memory point PM is maintained to earth whereas the vertical electrode EV corresponding to the memory point PM is polarised to a voltage $V_{reset}$. During this operation of re-initialisation, the other vertical electrodes EV are polarised to a voltage ⅓$V_{reset}$, the polarisation of the active electrodes EA is floating, and the other flat electrodes EP are polarised to a voltage ⅔$V_{reset}$. This thus signifies that during this operation, the target memory point PM sees a voltage $V_{reset}$ applied whereas the other memory points PM see a voltage equal to ⅓$V_{reset}$ applied for the memory point PM having in common with the target memory point PM the flat electrode EP or the vertical electrode EV and –⅓ $V_{reset}$ for the other memory points PM.

Figure 15A:
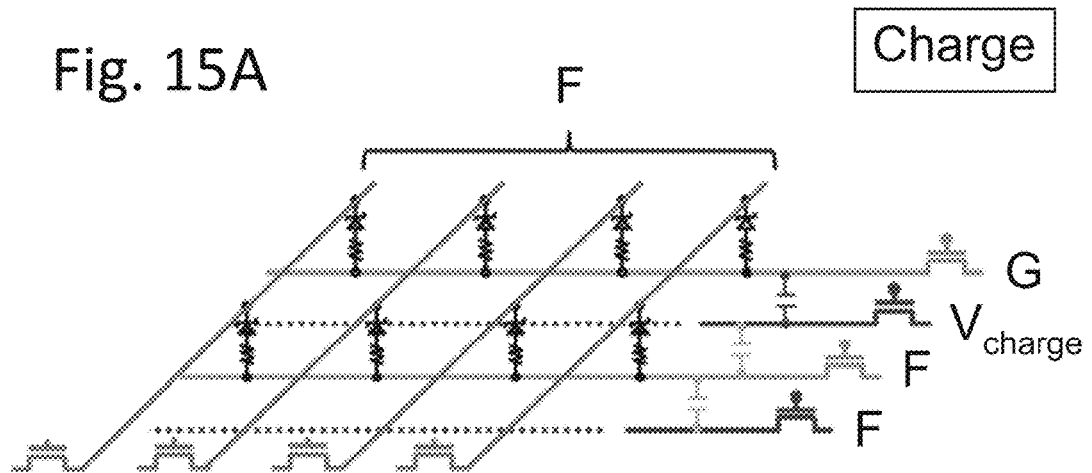
FIGS. 15A and 15B illustrate the operations of charging and discharging the energy storage zones of a component according to a first aspect of the invention.
Figure 15B:
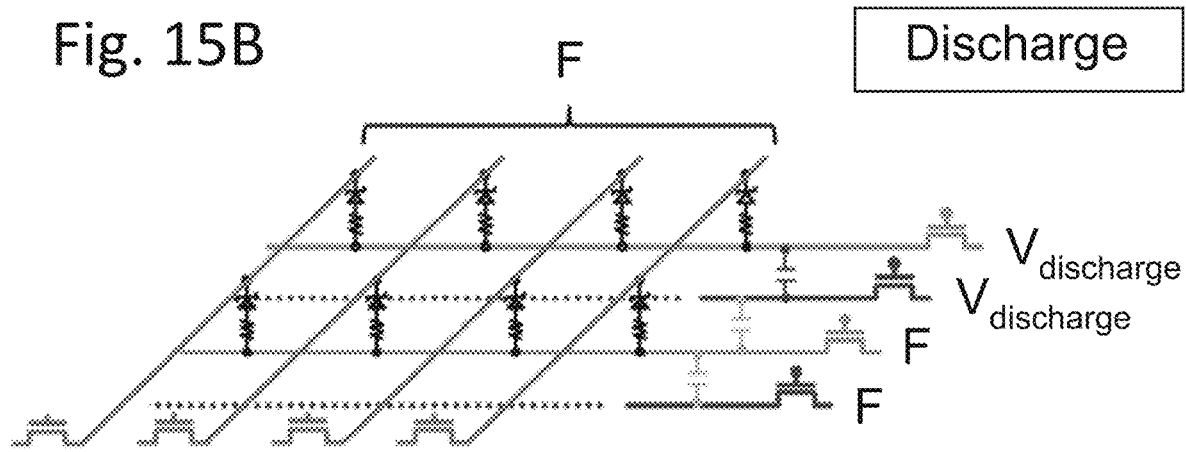

FIGS. 15A and 15B illustrate the operations of charging and discharging the energy storage zones ZSE. As illustrated in FIG. 15A, in order to charge an energy storage zone ZSE, the voltage $V_{charge}$ is applied to the active electrode EA corresponding to the energy storage zone ZSE that it is wished to charge whereas the potential of the flat electrode EP corresponding to the energy storage zone ZSE is maintained to earth. During this operation, the other electrodes are for their part at a floating potential (in other words disconnected from any potential reference). As illustrated in FIG. 15B, in order to discharge the energy storage zone ZSE, a discharge voltage $V_{discharge}$ is applied to the active electrode EA and to the flat electrode EP corresponding to the energy storage zone ZSE that it is wished to discharge. In the same way as for charging, the other electrodes are for their part at a floating potential.

It is important to note that the voltages applied for the operations of initialisation and re-initialisation of a memory point PM are applied during a very short time compared to the time required for the operations of charging and discharging the energy storage zones ZSE. The kinetic of the energy storage zones ZSE is thus only affected marginally during the operations of initialisation and/or re-initialisation. However, in order to ensure good charging of the energy storage zones ZSE, it is also possible to implement a cycle of charging the energy storage zone(s) corresponding to a memory point PM every $N_r$ cycles of initialisation/re-initialisation of the memory point PM where $N_r$ is the ratio between the characteristic time of operations of initialisation and re-initialisation of a memory point PM noted $t_m$ and the characteristic time of discharging an energy storage zone ZSE noted $t_{discharge}$, in other words $N_r = t_{discharge}/t_m$. In other words, when a memory point PM has undergone $N_r$ operations of initialisation or re-initialisation, the energy storage zone ZSE or the two energy storage zones ZSE corresponding to the memory point PM undergo a refreshment.

In an embodiment, the energy required at the step of using at least one component for the storage of information is supplied by the energy stored during the step in which at least one semiconductor component is used for the storage of energy. Thus, the energy is used and stored within a same device which considerably improves the integration of the energy supply of the components of the device.

The invention claimed is:

1. A semiconductor component comprising:
   a flat electrode defining a plane;
   an active electrode made of an ion source material, the active electrode being separated from the flat electrode by an electrolyte layer;
   a vertical pillar extending essentially along an axis perpendicular to the plane defined by the flat electrode, said vertical pillar including a vertical electrode and an information storage layer, the information storage layer covering a surface of the vertical electrode; the flat electrode and the vertical pillar being laid out so as to form a memory point;
   wherein the flat electrode:
      is made of an inert material; or
      comprises a first layer made of an ion source material and a second layer made of an inert material, the first layer facing the active electrode;

wherein materials of the active electrode and the electrolyte layer are chosen so as to form an energy storage zone with the flat electrode.

2. The component according to claim 1, wherein the vertical pillar further includes a selection layer, said selection layer being situated between the vertical electrode and the information storage layer or on the information storage layer.

3. The component according to claim 1, further comprising a plurality of flat electrodes, a plurality of electrolyte layers and a plurality of active electrodes, each flat electrode of the plurality of flat electrodes being laid out so as to form a memory point with the vertical pillar; and each active electrode of the plurality of active electrodes being separated from a flat electrode of the plurality of flat electrodes by an electrolyte layer of the plurality of electrolyte layers so as to form an energy storage zone.

4. The component according to claim 3, wherein each flat electrode comprises a first layer made of an ion source material and a second layer made of an inert material and a third layer made of an ion source material, said third layer facing an active electrode of the plurality of active electrodes, separated from said active electrode by an electrolyte layer of the plurality of electrolyte layers, said third layer, said electrolyte layer and said active electrode forming an energy storage zone.

5. The component according to claim 4, wherein the first layer and/or the third layer of each flat electrode of the plurality of flat electrodes are not in contact with the vertical pillar.

6. The component according to claim 4, wherein the first layer and/or the third layer of each flat electrode of the plurality of flat electrodes are separated from the vertical pillar by an insulating material.

7. The component according to claim 3, wherein the material of the vertical electrode and the material of the information storage layer are chosen so as to form, with the flat electrode or with each flat electrode of the plurality of flat electrodes, a phase change memory point or a resistive memory point.

8. The component according to claim 3, further comprising a plurality of vertical pillars each vertical pillar being laid out so as to form a memory point with the flat electrode or with each flat electrode of the plurality of flat electrodes.

9. The component according to claim 8, wherein a projection of the vertical pillars of the plurality of vertical pillars onto a plane parallel to the plane formed by the flat electrode or to the planes formed by the flat electrodes of the plurality of flat electrodes forms an array of which the unit cell is a square cell or a lozenge-shaped cell.

10. A semiconductor device comprising a component according to claim 1 and a system so that said component is used for the storage of information and/or for the storage of energy.

11. The semiconductor device according to claim 10, further comprising a second one of said component and a system so that the second component is used for the storage of information and/or for the storage of energy.

12. A method for using a device according to claim 11, comprising:
a step in which at least one among the first or the second semiconductor component is used for the storage of information;
a step in which at least one among the first or the second semiconductor component is used for the storage of energy.

13. The method according to claim 12, wherein the energy required for the step of using at least one component for the storage of information is supplied by the energy stored during the step in which at least one component is used for the storage of energy.

14. A semiconductor component comprising:
a flat electrode defining a plane;
an active electrode separated from the flat electrode by an electrolyte layer;
a vertical pillar extending essentially along an axis perpendicular to the plane defined by the flat electrode, said vertical pillar including a vertical electrode and an information storage layer, the information storage layer covering a surface of the vertical electrode; the flat electrode and the vertical pillar being laid out so as to form a memory point;
wherein materials of the active electrode and the electrolyte layer are chosen so as to form an energy storage zone with the flat electrode, said energy storage zone being charged or discharged by applying a voltage between the active electrode and the flat electrode, said voltage causing migration of ions from the active electrode in the electrolyte layer and the formation of an electromotive force in the energy storage zone.

15. A semiconductor device comprising:
a first semiconductor component including
a flat electrode defining a plane;
an active electrode separated from the flat electrode by an electrolyte layer;
a vertical pillar extending essentially along an axis perpendicular to the plane defined by the flat electrode, said vertical pillar including a vertical electrode and an information storage layer, the information storage layer covering a surface of the vertical electrode; the flat electrode and the vertical pillar being laid out so as to form a memory point;
wherein materials of the active electrode and the electrolyte layer are chosen so as to form an energy storage zone with the flat electrode,
a second component, and
an output circuit configured to pull energy generated by the energy storage zone to supply said energy to a second component.

* * * * *